United States Patent
Itoh et al.

(10) Patent No.: US 10,669,208 B2
(45) Date of Patent: Jun. 2, 2020

(54) OXIDE SINTERED BODY, METHOD FOR PRODUCING SAME AND SPUTTERING TARGET

(71) Applicant: TOSOH CORPORATION, Shunan-shi (JP)

(72) Inventors: Kenichi Itoh, Ayase (JP); Hiroyuki Hara, Ayase (JP); Shinichi Hara, Ayase (JP)

(73) Assignee: TOSOH CORPORATION, Shunan-shi (JP)

( * ) Notice: Subject to any disclaimer, the term of this patent is extended or adjusted under 35 U.S.C. 154(b) by 0 days.

(21) Appl. No.: 16/068,596

(22) PCT Filed: Dec. 28, 2016

(86) PCT No.: PCT/JP2016/089029
§ 371 (c)(1),
(2) Date: Jul. 6, 2018

(87) PCT Pub. No.: WO2017/119381
PCT Pub. Date: Jul. 13, 2017

(65) Prior Publication Data
US 2019/0016638 A1    Jan. 17, 2019

(30) Foreign Application Priority Data

Jan. 8, 2016 (JP) ................................ 2016-002924
Nov. 28, 2016 (JP) ................................ 2016-230493

(51) Int. Cl.
| | | |
|---|---|---|
| C04B 35/64 | (2006.01) | |
| C04B 35/453 | (2006.01) | |
| H01J 37/34 | (2006.01) | |
| C23C 14/34 | (2006.01) | |
| C23C 14/08 | (2006.01) | |
| C04B 35/626 | (2006.01) | |

(52) U.S. Cl.
CPC ...... *C04B 35/453* (2013.01); *C04B 35/62655* (2013.01); *C04B 35/64* (2013.01); *C23C 14/08* (2013.01); *C23C 14/081* (2013.01); *C23C 14/086* (2013.01); *C23C 14/3414* (2013.01); *H01J 37/3429* (2013.01); *C04B 2235/3217* (2013.01); *C04B 2235/3222* (2013.01); *C04B 2235/3251* (2013.01); *C04B 2235/3255* (2013.01); *C04B 2235/3284* (2013.01); *C04B 2235/5409* (2013.01); *C04B 2235/602* (2013.01); *C04B 2235/6562* (2013.01); *C04B 2235/6565* (2013.01); *C04B 2235/6567* (2013.01); *C04B 2235/72* (2013.01); *C04B 2235/77* (2013.01); *C04B 2235/786* (2013.01); *C04B 2235/80* (2013.01); *C04B 2235/96* (2013.01)

(58) Field of Classification Search
CPC ... C04B 35/453; C04B 35/64; C04B 2235/80; C04B 2235/3222; C04B 2235/3251; C04B 2235/3284; C23C 14/081; C23C 14/086
See application file for complete search history.

(56) References Cited

U.S. PATENT DOCUMENTS

| 6,528,442 B1 | 3/2003 | Kuwano et al. |
| 2014/0102893 A1* | 4/2014 | Sogabe ............... C23C 14/086 204/298.13 |

FOREIGN PATENT DOCUMENTS

| JP | 2000119062 A | * | 1/2000 | ............ C23C 14/34 |
| JP | 2000-119062 A | | 4/2000 | |
| JP | 2005-256175 A | | 9/2005 | |
| JP | 2005-317093 A | | 11/2005 | |
| JP | 2009-221589 A | | 10/2009 | |
| JP | 2009-298649 A | | 12/2009 | |
| JP | 2013-36073 A | | 2/2013 | |

OTHER PUBLICATIONS

International Preliminary Report on Patentability and Written Opinion dated Jul. 10, 2018 in PCT/JP2016/089029 (submitting English translation only), 6 pages.

* cited by examiner

*Primary Examiner* — Noah S Wiese
(74) *Attorney, Agent, or Firm* — Oblon, McClelland, Maier & Neustadt, L.L.P.

(57) ABSTRACT

An oxide sintered body is provided which does not splash from the target surface even at the time of high power film formation, has a high film formation rate, and is used in a sputtering target capable of providing a high-refractive-index film.
An oxide sintered body is used which contains zinc, niobium, aluminum and oxygen as constituent elements and in which $Nb/(Zn+Nb+Al)=0.076$ to $0.289$ and $Al/(Zn+Nb+Al)=0.006$ to $0.031$, where Zn, Nb and Al denote contents of zinc, niobium and aluminum, respectively.

20 Claims, No Drawings

OXIDE SINTERED BODY, METHOD FOR PRODUCING SAME AND SPUTTERING TARGET

TECHNICAL FIELD

The present invention relates to an oxide sintered body containing zinc, niobium, aluminum, and oxygen as constituent elements and a sputtering target containing the sintered body.

BACKGROUND ART

In recent years, high-refractive-index films have been adopted for adjusting the refractive index of portable displays and building material glasses. A general niobium oxide target as a high-refractive-index material cannot obtain the conductivity of a DC dischargeable target by an atmospheric sintering process, and thus the conductivity of the sintered body is enhanced by reducing the sintered body under high temperature and pressure conditions (see, for example, Patent Literature 1).

It has also been reported that the resistivity decreases as zinc is added to niobium oxide (see, for example, Patent Literature 2).

However, in any case of these methods, since any of these methods are required to employ a hot press method and a huge press mechanism is required for producing a large target, thus these methods are not a realistic process, and the target size is limited to small products. In addition, in the hot press method, sintering is conducted in a reducing atmosphere and thus the quantity of oxygen deficiency in the target tends to increase. For a target with a large quantity of oxygen deficiency, oxygen is required to be introduced as a sputtering gas at the time of sputtering in order to obtain high transmittance and a problem also arises that the film formation rate decreases by the introduction of oxygen.

In addition, a composite oxide sintered body composed of zinc, aluminum, and titanium has been reported as a high-refractive-index target (see, for example, Patent Literature 3). It is said that a composite oxide sintered body exhibiting less arcing occurrence and stable DC discharge performance is obtained from a titanium-containing zinc oxide-based target as well as a high refractive index of 2.0 or more is realized by the titanium-containing zinc oxide-based target. However, titanium has an extremely low film formation rate to be a half or less than that of niobium, which is the same high-refractive-index material as titanium, and there has been a problem that the titanium-containing target exhibits low sputtering productivity.

In recent years, adoption of cylindrical targets to which high power loads can be input and the like also proceed and film formation to which high power, which has not been hitherto assumed, is input is becoming mainstream. Furthermore, a sintered body obtained by mixing niobium oxide or titanium oxide of a high-refractive-index material as described above with zinc oxide is DC dischargeable in a mixed system of a conductive phase composed mainly of zinc oxide and an insulating phase which is a composite oxide of a high-refractive-index material and zinc oxide, but the conductive phase and the insulating phase coexist in this sintered body, and thus there is a problem that the sputtering current concentrates on the zinc oxide of the conductive phase, zinc oxide is reduced, metal zinc having a low melting point is splashed, and particles are generated as well as holes are formed on the target surface.

CITATION LIST

Patent Literature

Patent Literature 1: Japanese Unexamined Patent Publication No. 2005-256175
Patent Literature 2: Japanese Unexamined Patent Publication No. 2005-317093
Patent Literature 3: Japanese Unexamined Patent Publication No. 2009-298649

SUMMARY OF INVENTION

Technical Problem

An object of the present invention is to provide an oxide sintered body which does not splash from the target surface even at the time of high power film formation, has a high film formation rate, and is used in a sputtering target capable of providing a high-refractive-index film.

Solution to Problem

The inventors of the present invention have carried out intensive investigations on a composite oxide sintered body composed of a ZnO phase and a $Zn_3Nb_2O_3$ phase. Among the crystal phases forming the composite oxide, the $Zn_3Nb_2O_8$ phase is a material exhibiting extremely low conductivity and the bulk resistance of the single phase is $10^{11}$ Ω·cm or more. Meanwhile, the ZnO phase exhibits slight conductivity by oxygen deficiency or substitution with a trace amount of niobium by solid dissolution. The inventors of the present invention have achieved that splashing from the target surface during sputtering is suppressed and excellent discharge characteristics are realized by using a sintered body as a sputtering target, obtained by precipitating a $ZnAl_2O_4$ phase (bulk resistance of single phase: $10^8$ Ω·cm) having a resistivity between those of an insulating $Zn_3Nb_2O_8$ phase and a conductive ZnO phase while decreasing the resistance of the ZnO phase by solid dissolution of aluminum through the addition of $Al_2O_3$.

In other words, the present invention resides in the following [1] to [8].

[1] An oxide sintered body containing zinc, niobium, aluminum and oxygen as constituent elements, in which Nb/(Zn+Nb+Al)=0.076 to 0.289 and Al/(Zn+Nb+Al)=0.006 to 0.031, where Zn, Nb and Al denote contents of zinc, niobium and aluminum, respectively.

[2] The oxide sintered body according to [1], in which a relative density of the oxide sintered body is 98% or more.

[3] The oxide sintered body according to [1], in which a density of the oxide sintered body is 5.57 g/cm³ or more.

[4] The oxide sintered body according to any one of [1] to [3], in which a crystal grain size of a ZnO phase in the oxide sintered body is 3 or less.

[5] The oxide sintered body according to any one of [1] to [4], in which a bulk resistance value of the oxide sintered body is 100 Ω·cm or less.

[6] A sputtering target comprising the oxide sintered body according to any one of [1] to [5] as a target material.

[7] A method for producing an oxide sintered body, the method comprising mixing a zinc oxide powder, a niobium oxide powder and an aluminum oxide powder as raw material powders so that atomic ratios of elements are Nb/(Zn+Nb+Al)=0.076 to 0.289 and Al/(Zn+Nb+Al)=0.006 to 0.031, where Zn, Nb and Al denote contents of zinc, niobium and aluminum, respectively,
molding a mixed powder obtained, and
calcining a molded body obtained.

[8] A thin film containing zinc, niobium, aluminum and oxygen as constituent elements, in which Nb/(Zn+Nb+Al)=0.076 to 0.289 and Al/(Zn+Nb+Al)=0.006 to 0.031, where Zn, Nb and Al denote contents of zinc, niobium and aluminum, respectively.

Hereinafter, the present invention will be described in detail.

The present invention is an oxide sintered body which contains zinc, niobium, aluminum and oxygen as constituent elements and in which Nb/(Zn+Nb+Al)=0.076 to 0.289 and Al/(Zn+Nb+Al)=0.006 to 0.031, where Zn, Nb and Al denote contents of zinc, niobium and aluminum, respectively.

Niobium contained in the oxide sintered body of the present invention has an atomic ratio Nb/(Zn+Nb+Al) of from 0.076 to 0.289 and preferably from 0.135 to 0.230 where Zn, Nb and Al denote the contents of zinc, niobium and aluminum, respectively. The refractive index of the film to be obtained by sputtering decreases when Nb/(Zn+Nb+Al) is less than 0.076, and the $Zn_3Nb_2O_8$ phase increases and the resistance increases when Nb/(Zn+Nb+Al) exceeds 0.289.

Meanwhile, aluminum contained in the oxide sintered body has an atomic ratio Al/(Zn+Nb+Al) of from 0.006 to 0.031 and preferably from 0.013 to 0.025. The $ZnAl_2O_4$ phase is not sufficiently formed and splashing from the target surface occurs at the time of sputtering when Al/(Zn+Nb+Al) is less than 0.006. It is not preferable that Al/(Zn+Nb+Al) exceeds 0.031 since the transmittance on the low wavelength side of the thin film formed by sputtering decreases.

The oxide sintered body of the present invention is composed of three phases of a ZnO phase, a $ZnAl_2O_4$ phase and a $Zn_3Nb_2O_8$ phase when the constituent elements zinc, niobium and aluminum have the composition described above, splashing from the target surface is suppressed during sputtering, and the oxide sintered body exhibits excellent discharge characteristics. The $ZnAl_2O_4$ phase is sufficiently formed when the value of the diffraction intensity ratio $I_2/I_1$ is 0.03 or more, where $I_1$ denotes the maximum intensity of the diffraction peak (corresponding to the ZnO phase) present between 35.9° and 36.5° of incident angles (2θ) in X-ray diffraction and $I_2$ denotes the maximum intensity of the diffraction peak (corresponding to the $ZnAl_2O_4$ phase) present between 36.6° and 37.2°.

In addition, in the oxide sintered body of the present invention, the amount of metal elements (impurities) other than zinc, niobium and aluminum is preferably 1 atm % or less and more preferably 0.1 atm % or less.

The relative density of the oxide sintered body of the present invention is preferably 98% or more, more preferably 99% or more, and particularly preferably 100% or more. The theoretical density to be used for calculating the relative density will be described later, but a weighted average of the densities of the respective crystal phases (ZnO phase, $ZnAl_2O_4$ phase, and $Zn_3Nb_2O_8$ phase) when it is assumed that there is no solid dissolution is used since it is difficult to identify the amounts of the respective elements solid-dissolved with respect to the respective oxides. Hence, the density of the sintered body exceeds the theoretical density defined by the present invention in some cases. When the relative density is less than 98%, there is a tendency that zinc oxide is reduced and splashing occurs by the occurrence of arcing in the case of using the present material as a sputtering target. The density of the sintered body is preferably 5.57 g/cm$^3$ or more, more preferably 5.61 g/cm$^3$ or more, and particularly preferably 5.70 g/cm$^3$ or more.

In the oxide sintered body of the present invention, the average crystal grain size of the ZnO phase in the oxide sintered body is preferably 3 µm or less, more preferably 2 µm or less, and particularly preferably 1.5 µm or less. The electric field concentration on the ZnO phase during sputtering is remarkable, ZnO is likely to be reduced, and splashing from the target surface occurs when the crystal grain size of the ZnO phase is too large.

In the case of using the oxide sintered body of the present invention as a sputtering target, the bulk resistance value is preferably 100 Ω·cm or less and more preferably 50 Ω·cm or less in order to stably perform DC discharge without decreasing the film forming rate.

The load input to the target is normalized by the power density (W/cm$^2$) obtained by dividing the power input by the target area. The general power density in normal production is about from 1 to 4 W/cm$^2$, but in the present invention, an oxide sintered body to be a high-quality target material, from which arcing extremely hardly occurs even under a high power condition exceeding 4 W/cm$^2$, is obtained.

Next, the method for producing an oxide sintered body of the present invention will be described.

The method for producing an oxide sintered body of the present invention includes mixing a zinc oxide powder, a niobium pentoxide powder and an aluminum oxide powder as raw material powders so that the atomic ratios of the elements are Nb/(Zn+Nb+Al)=0.076 to 0.289 and Al/(Zn+Nb+Al)=0.006 to 0.031, where Zn, Nb and Al denote the contents of zinc, niobium and aluminum, respectively, molding the mixed powder obtained, and then calcining the molded body obtained.

Hereinafter, each step in the method for producing an oxide sintered body of the present invention will be described.

(1) Raw Material Mixing Step

The raw material powders are preferably the respective oxide powders of zinc oxide, niobium pentoxide, and aluminum oxide powders in consideration of ease of handling. The purity of the respective raw material powders is preferably 99.9% or more and more preferably 99.99% or more. Abnormal grain growth is caused in the calcination step when impurities are contained in the raw material powders.

In the present step, it is required to mix the zinc oxide powder, the niobium pentoxide powder and the aluminum oxide powder so that the atomic ratios of the elements are Nb/(Zn+Nb+Al)=0.076 to 0.289 and Al/(Zn+Nb+Al)=0.006 to 0.031, where Zn, Nb and Al denote the contents of zinc, niobium and aluminum, respectively. With regard to niobium, it is more preferable that Nb/(Zn+Nb+Al) is from 0.135 to 0.230, and with regard to aluminum, it is more preferable that Al/(Zn+Nb+Al) is from 0.013 to 0.025.

In the oxide sintered body of the present invention, it is important to miniaturize the ZnO powder and to uniformly mix and pulverize the ZnO powder with the $Nb_2O_5$ powder and the slightly added $Al_2O_3$ powder in the mixed powder of a raw material since it is required to have a small crystal grain size of the ZnO phase and to uniformly disperse the ZnO phase in the sintered body. As a rough standard of mixing, the increased quantity of the BET value of the mixed powder before and after mixing is preferably 2 $m^2/g$ or more, more preferably 3 $m^2/g$ or more, and particularly preferably 6 $m^2/g$ or more. There is a possibility that mixing is insufficient and segregation of the respective elements occurs in a case in which the quantity of the BET value increased is less than 2 $m^2/g$. The BET value of the mixed powder before mixing is determined from the mixing ratios of the respective raw material powders by a weighted average according to the following calculation formula. The weighted average of the BET values of the mixed powder is calculated by $(BZ \times WZ + BN \times WN + BA \times WA)/100$, where BZ [$m^2/g$] denotes the BET value of the ZnO powder to be used, WZ [wt %] denotes the weight ratio of the ZnO powder, BN [$m^2/g$] denotes the BET value of the $Nb_2O_5$ powder, WN [wt %] denotes the weight ratio of the $Nb_2O_5$ powder, BA [$m^2/g$] denotes the BET value of the $Al_2O_3$ powder, and WA [wt %] denotes the weight ratio of the $Al_2O_3$ powder.

Furthermore, the BET value of the mixed powder after mixing is preferably 6 $m^2/g$ or more, more preferably 7 $m^2/g$ or more, and particularly preferably 10 $m^2/g$ or more in order to obtain a high-density sintered body.

The pulverizing and mixing method of the powders is not particularly limited as long as the powders can be sufficiently pulverized and mixed, but examples thereof may include mixing methods such as mixing by dry or wet media stirring type mills using balls and beads of zirconia, alumina, a nylon resin and the like, media-less container rotary mixing, and mechanical stirring type mixing. Specific examples of the pulverizing and mixing method may include a ball mill, a bead mill, an attritor, a vibration mill, a planetary mill, a jet mill, a V mixer, a paddle mixer, and a biaxial planet stirring mixer, but it is suitable to use, for example, a wet type bead mill having relatively high pulverizing ability by a wet method capable of enhancing dispersibility in order to easily conduct pulverization and mixing.

It is preferable to conduct the treatment under the following conditions in the case of treating the powder by using the wet type bead mill apparatus.

The solid concentration in the slurry is from 35% to 65% and more preferably from 50% to 60%. The pulverizing ability decreases and desired values of physical properties of the powder are not obtained when the solid concentration is too high. In consideration of prevention of contamination of the raw material by impurities due to abrasion, zirconia beads are used as the pulverization media and the bead diameter is set to be in a range of from 0.2 to 0.3 mm φ in which the pulverizing force can be enhanced. The amount of beads to be charged into the mill is set to be in a range of from 75% to 90% as the bead filling rate with respect to the mill volume.

The kind of the dispersant is not particularly limited, but it is important to suppress the change in slurry viscosity to a certain level or less. There is a case in which the slurry viscosity rises by some factors even under the same conditions depending on the batch of treatment, and in this case, stable physical properties of the powder can be obtained by appropriately adjusting the amount of the dispersant and keeping the slurry viscosity always within from 500 to 2000 mPa·s. It is required to strictly manage the slurry temperature as well, and the slurry temperature at the outlet of the mill is always managed to be 18° C. or less as well as the slurry temperature at the inlet of the mill is managed to be 12° C. or less and preferably 9° C. or less.

The number of revolutions of the beads is set to from 6 to 15 m/sec as the peripheral speed at the outermost periphery of the bead stirring blades. The pulverizing force weakens, the treatment time until the intended physical properties of the powder are achieved lengthens, and the productivity is remarkably inferior when the peripheral speed is slow. Meanwhile, it is not preferable that the peripheral speed is fast the heat generation accompanying pulverization increases, the slurry temperature rises, and the operation becomes difficult although the pulverizing force is stronger.

The operation conditions of the bead mill are adjusted based on the above conditions. It is preferable that the treatment time is set so that at least the number of pulverization passes into the mill is 10 or more times of treatments in consideration of the dispersibility of the raw material powder even in the case of using a high BET raw material powder.

The slurry after being subjected to the wet mixing treatment can be used as it is in a wet molding method such as cast molding, but it is desirable to use a dry granulated powder, in which the flowability of powder is high and the density of molded body is uniform, in the case of dry molding. The granulation method is not limited, but spray granulation, fluid bed granulation, rolling granulation, stirring granulation, and the like can be used. In particular, it is desirable to use spray granulation, which is easily operated and can treat the powder in a large amount. Incidentally, a molding auxiliary such as polyvinyl alcohol, acrylic polymer, methyl cellulose, waxes, or oleic acid may be added to the raw material powder at the time of molding treatment.

(2) Molding Step

The molding method is not particularly limited and a molding method capable of forming the mixed powder obtained in the step (1) into a desired shape can be appropriately selected. Examples thereof may include a press molding method, a cast molding method, and an injection molding method.

The molding pressure is not particularly limited as long as it is a pressure at which cracking and the like of the molded body do not occur and a molded body capable of being handled is obtained, but it is preferable to increase the molding density as much as possible. It is also possible to use a method such as cold isostatic press (CIP) molding in order to achieve the molding pressure and molding density. The CIP pressure is preferably 1 ton/$cm^2$ or more, more preferably 2 ton/$cm^2$ or more, and particularly preferably from 2 to 3 ton/$cm^2$ in order to obtain a sufficient consolidation effect.

(3) Calcination Step

Next, the molded body obtained in the step (2) is calcined. For calcination, it is possible to appropriately select a calcination method capable of obtaining a uniform sintered body having a high density and to use a general resistance heating type electric furnace, a microwave heating furnace, or the like.

As the calcination conditions, for example, the retention temperature for calcination is from 1000° C. to 1300° C. and the retention time is preferably from 0.5 to 10 hours and more preferably from 1 to 5 hours. It is not preferable that the calcination temperature is low and the retention time is short since the density of the sintered body decreases. Meanwhile, it is not preferable that the calcination temperature is high and the retention time is long since crystal grains grow and microscopic segregation of the respective elements is caused. The electric field concentration on the ZnO phase during sputtering is remarkable, ZnO is likely to be reduced, and splashing from the target surface occurs when the crystal grain size of the ZnO phase is too large. The calcination atmosphere can be either an air atmosphere or oxygen atmosphere which is an oxidizing atmosphere. Special atmosphere control is not required but calcination can be conducted in the air atmosphere.

The oxide sintered body is composed of three phases of a ZnO phase, a $ZnAl_2O_4$ phase and a $Zn_3Nb_2O_8$ phase and the value of the diffraction intensity ratio $I_2/I_1$ is 0.03 or more, where $I_1$ denotes the maximum intensity of the diffraction peak (corresponding to the ZnO phase) present between 35.9° and 36.5° of incident angles (2θ) in X-ray diffraction and $I_2$ denotes the maximum intensity of the diffraction peak (corresponding to the $ZnAl_2O_4$ phase) present between 36.6° and 37.2°, when the calcination is conducted under the calcination conditions described above.

(4) Target Forming Step

The sintered body obtained is ground into a desired shape such as a plate shape, a circular shape, or a cylindrical shape by using a machine for mechanical processing such as a surface grinding machine, a cylindrical grinding machine, a lathe, a cutting machine, or a machining center. Furthermore, a sputtering target using the sintered body of the present invention as a target material can be obtained by bonding the sintered body to a backing plate or backing tube made of oxygen-free copper, titanium or the like using indium solder or the like, if necessary. The surface roughness (Ra) of the target is preferably 1 µm or less and more preferably 0.5 µm or less in order to suppress arcing immediately after the start of use.

A thin film, which contains zinc, niobium, aluminum and oxygen as constituent elements and in which Nb/(Zn+Nb+Al)=0.076 to 0.289 and Al/(Zn+Nb+Al)=0.006 to 0.031, where Zn, Nb and Al denote contents of zinc, niobium and aluminum, respectively, is obtained when a film is formed using the sputtering target described above. Such a thin film has a high refractive index and can be suitably used as an insulating film.

Advantageous Effects of Invention

In the case of using the oxide sintered body of the present invention as a sputtering target, splashing from the target surface does not occur, a stable DC discharge is possible, a high film formation rate is obtained, and an insulating film having a high refractive index can be obtained even when inputting high power and under sputtering conditions having a high oxygen partial pressure at which arcing is likely to occur.

EXAMPLES

Hereinafter, the present invention will be more specifically described with reference to Examples, but the present invention is not limited thereto. Incidentally, the respective measurements in the present Examples were conducted as follows.

(1) Density of Sintered Body

The relative density of the sintered body was determined by measuring the bulk density thereof by the Archimedes method in conformity to JIS R1634 and dividing the bulk density by the theoretical density. The theoretical density of the sintered body was calculated by the weighted average represented by the following formula using the weight a [g] of the ZnO phase, the weight b [g] of the $Zn_3Nb_2O_8$ phase and the weight c [g] of the $ZnAl_2O_4$ phase and the respective true densities thereof 5.606 [g/cm$^3$], 5.734 [g/cm$^3$] and 4.700 [g/cm$^3$] when being calculated on the assumption that all $Nb_2O_5$ phases in the sintered body reacts as a $Zn_3Nb_2O_8$ phase and all $Al_2O_3$ phases reacts as a $ZnAl_2O_4$ phase.

$$d=(a+b+c)/((a/5.606)+(b/5.734)+(c/4.700)) \quad (1)$$

(2) X-Ray Diffraction Test

The X-ray diffraction pattern of the sintered body sample subjected to mirror polishing was measured in a range of 2θ=20° to 70°.
  Scanning method: step scanning method (FT method)
  X-ray source: CuKα
  Power: 40 kV, 40 mA
  Step width: 0.01°

(3) Crystal Grain Size

The sintered body was subjected to mirror polishing, the ZnO phase, the $Zn_3Nb_2O_8$ phase, and the $ZnAl_2O_4$ phase were identified through composition analysis by EPMA, and then the crystal grain size of the ZnO phase was measured from the SEM image by the diameter method. Three or more arbitrary samples were observed, and 300 or more particles were measured for each sample. In addition, grain boundary identification is easy when chemical etching using an acid is conducted concurrently.

Conditions for EPMA Analysis

Apparatus: wavelength dispersion type electron beam microanalyzer
  Acceleration voltage: 15 kV
  Irradiation current: 30 nA (4) Measurement of Resistivity The average value of 10 samples cut out from arbitrary portions after being ground by 1 mm or more from the surface of the sintered body after calcination was taken as the measurement data.
  Sample size: 10 mm×20 mm×1 mm
  Measurement method: four-terminal method
  Measurement apparatus: LORESTA HP MCP-T410 (manufactured by Mitsubishi Chemical Corporation)

(5) Sputtering Evaluation

The sintered body obtained was processed into 101.6 mm φ×6 mm t and then bonded to a backing plate made of oxygen-free copper using indium solder to obtain a sputtering target. This target was subjected to the evaluation on film formation and then the evaluation on the DC discharge stability under the following conditions.

The refractive index of the thin film sample obtained in the evaluation on film formation was measured by using a spectroscopic ellipsometer (trade name: M-2000V-Te manufactured by J. A. Woollam), the value at a wavelength of 550 nm was used, and the maximum value of the transmittance at a wavelength of from 350 to 450 nm was measured as a value including the transmittance of the glass substrate by using a spectrophotometer (trade name: U-4100 manufactured by Hitachi High-Technologies Corporation). In addition, the film formation rate was calculated by fabricating a thin film sample formed for 30 minutes under the sputtering conditions for evaluation on film formation and measuring the film thickness thereof by using a surface shape measuring instrument (trade name: Dektak3030 manufactured by ULVAC, Inc.).

Sputtering Conditions for Evaluation on Film Formation

Gas: argon + oxygen (3%)
Pressure: 0.6 Pa
Power supply: DC
Input power: 200 W (2.4 W/cm$^2$)
Film thickness: 80 nm
Substrate: non-alkali glass (EAGLE XG manufactured by Corning, thickness: 0.7 mm)
Substrate temperature: room temperature
(Sputtering conditions for evaluation on DC discharge stability)
Gas: argon + oxygen (3%)
argon + oxygen (6%)
Pressure: 0.6 Pa
Power supply: DC
Input power: 600 W (7.4 W/cm$^2$)
800 W (9.9 W/cm$^2$)
Discharge time: 30 min
Evaluation: number of splashes on target surface after discharge (visual observation).

Example 1

A zinc oxide powder having a BET value of 3.8 m$^2$/g, a niobium oxide powder having a BET value of 5.4 m$^2$/g, and an aluminum oxide powder having a BET value of 12 m$^2$/g (all of these have a purity of 99.9% or more) were weighed so as to have a proportion of 0.230 for Nb/(Zn+Nb+Al) and 0.020 for Al/(Zn+Nb+Al). The powders weighed were foamed into a slurry using 10 kg of pure water and a polyacrylate-based dispersant was added to the slurry at 0.1 wt % with respect to the total powder amount, thereby preparing a slurry having a solid concentration of 60%. Zirconia beads having 0.3 mm $\phi$ were filled by 85% in a bead mill having an internal volume of 2.5 L, and the slurry was circulated in the mill at a mill peripheral speed of 7.0 m/sec and a slurry supply rate of 2.5 L/min to be pulverized and mixed. Furthermore, the temperature was managed in a range in which the temperature in the slurry supply tank was from 8° C. to 9° C. and the slurry temperature at the outlet was from 14° C. to 16° C., and the number circulations (number of passes) in the mill was set to 15. Thereafter, the slurry thus obtained was spray-dried, the powder dried was allowed to pass through a 150 μm sieve, and a molded body in 120 mm×120 mm×8 mm t was fabricated at a pressure of 300 kg/cm$^2$ by a press molding method and then subjected to CIP treatment at a pressure of 2 ton/cm$^2$.

Next, this molded body was placed on a setter made of alumina and calcined under the following calcination conditions by using a resistance heating type electric furnace (furnace internal volume: 250 mm×250 mm×250 mm). The sintered body thus obtained and the sputtering evaluation results for the sputtering target are presented in Table 1.

Calcination Conditions

Calcination temperature: 1250° C.
Retention time: 3 hours
Rate of temperature increase: 300° C./hr from 950° C. to 1250° C.
100° C./hr in other temperature regions
Atmosphere: air atmosphere
Rate of temperature decrease: 100° C./hr to 950° C.
150° C./hr from 950° C.

Examples 2 to 8 and Comparative Examples 1 to 5

Sintered bodies were fabricated by the same method as in Example 1 (the number of passes of the bead mill was changed to 10 in Example 7) except that the composition was changed to those presented in Table 1. In Comparative Examples 3 and 4, the bulk resistance of the sintered bodies was high and DC discharge was impossible. The sintered bodies thus obtained and the sputtering evaluation results for the sputtering targets are presented in Table 1.

Example 9

A sintered body was fabricated by the same method as in Example 1 except that conditions for pulverization using a bead mill and the conditions for calcination using a microwave (frequency: 2.45 GHz) heating type calcination furnace (furnace internal volume: 300 mm×300 mm×300 mm) were changed as follows. The sintered body thus obtained and the sputtering evaluation results for the sputtering target are presented in Table 1.

Pulverization Conditions

Mill peripheral speed: 13 m/sec
Number of circulations (number of passes) in mill: 20 times
(Calcination conditions)
Calcination temperature: 1200° C.
Retention time: 1 hour
Rate of temperature increase: 900° C./hr from 200° C. to 1250° C.
100° C./hr in other temperature regions
Atmosphere: air atmosphere
Rate of temperature decrease: 400° C./hr to 950° C.
200° C./hr from 950° C.

Example 10

A sintered body was fabricated by the same method as in Example 9 except that the temperature for calcination using a microwave heating furnace was set to 1150° C. The sintered body thus obtained and the sputtering evaluation results for the sputtering target are presented in Table 1.

Example 11

A sintered body was fabricated by the same method as in Example 9 except that a zinc oxide powder having a BET value of 9.6 m$^2$/g and a niobium oxide powder having a BET value of 7.9 m$^2$/g (all of these have a purity of 99.9% or more) were used as raw material powders and the temperature for calcination using a microwave heating furnace was set to 1100° C. The sintered body thus obtained and the sputtering evaluation results for the sputtering target are presented in Table 1.

Measurement of Thin Film Resistivity

The resistivity of the thin films obtained in Examples 1 to 11 was measured by a four-terminal method using LORESTA HP MCP-T410 (manufactured by Mitsubishi Chemical Corporation). The thin films obtained were all a high-resistance film having a thin film resistance of 10$^8$ Ω·cm or more.

Reference Example

Film formation was conducted under the same sputtering conditions for the evaluation on film formation as in Example using a reduced Nb$_2$O$_5$ target (manufactured by TOSHIMA MANUFACTURING CO., LTD.) having a size of 101.6 mm φ×6 mm t. The film formation rate was 9.0 nm/min when the sputtering gas was argon+oxygen (3%) and 7.4 nm/min when the sputtering gas was argon+oxygen (5%) at which the transmittance of the thin film was saturated with respect to oxygen gas.

TABLE 1

| | Composition Nb/Zn + Nb + Al | Composition Al/Zn + Nb + Al | Quantity of BET value increased m$^2$/g | BET value m$^2$/g | Density g/cm$^3$ | Relative density % | Crystal grain size μm | Bulk resistance Ω·cm | Intensity ratio in X-ray diffraction |
|---|---|---|---|---|---|---|---|---|---|
| Example 1 | 0.230 | 0.020 | 3.0 | 7.4 | 5.627 | 99.34 | 2.83 | 3 | 0.057 |
| Example 2 | 0.230 | 0.013 | 3.0 | 7.4 | 5.648 | 99.58 | 2.75 | 18 | 0.041 |
| Example 3 | 0.230 | 0.031 | 3.0 | 7.5 | 5.611 | 99.25 | 2.66 | 8 | 0.078 |
| Example 4 | 0.076 | 0.025 | 3.5 | 7.6 | 5.581 | 99.56 | 2.62 | 0.5 | 0.042 |
| Example 5 | 0.289 | 0.009 | 3.1 | 7.6 | 5.647 | 99.18 | 2.77 | 85 | 0.044 |
| Example 6 | 0.230 | 0.006 | 3.2 | 7.6 | 5.656 | 99.59 | 2.88 | 19 | 0.031 |
| Example 7 | 0.230 | 0.020 | 2.4 | 6.8 | 5.576 | 98.43 | 3.00 | 5 | 0.057 |
| Example 8 | 0.135 | 0.031 | 3.4 | 7.7 | 5.593 | 99.52 | 2.63 | 0.7 | 0.050 |
| Example 9 | 0.230 | 0.020 | 6.4 | 10.8 | 5.708 | 100.77 | 1.98 | 0.9 | 0.051 |
| Example 10 | 0.230 | 0.020 | 6.4 | 10.8 | 5.705 | 100.72 | 1.47 | 0.3 | 0.048 |
| Example 11 | 0.230 | 0.020 | 6.0 | 15.1 | 5.731 | 101.18 | 0.95 | 3 | 0.041 |
| Comparative Example 1 | 0.230 | 0.036 | 2.8 | 7.3 | 5.589 | 98.98 | 2.51 | 13 | 0.088 |
| Comparative Example 2 | 0.063 | 0.026 | 3.2 | 7.3 | 5.579 | 99.63 | 2.63 | 0.2 | 0.043 |
| Comparative Example 3 | 0.230 | 0.000 | 3.3 | 7.6 | 5.644 | 99.26 | 2.70 | 14950 | — |
| Comparative Example 4 | 0.333 | 0.010 | 2.7 | 7.3 | 5.635 | 98.75 | 2.91 | 12400 | 0.061 |
| Comparative Example 5 | 0.230 | 0.005 | 3.1 | 7.5 | 5.656 | 99.57 | 2.98 | 5 | 0.025 |

| | Thin film characteristics | | Film | Discharge characteristics, number of splashes | | | |
|---|---|---|---|---|---|---|---|
| | Refractive index | Transmittance ※ | formation rate | Argon + oxygen (3%) | | Argon + oxygen (6%) | |
| | (550 nm) | % | nm/min | (600 W) | (800 W) | (600 W) | (800 W) |
| Example 1 | 2.10 | 75.6 | 13.4 | 0 | 0 | 8 | — |
| Example 2 | 2.11 | 78.1 | 13.5 | 0 | 0 | — | — |
| Example 3 | 2.10 | 72.9 | 13.3 | 0 | 0 | — | — |
| Example 4 | 2.00 | 73.2 | 14.5 | 0 | 0 | — | — |
| Example 5 | 2.15 | 80.1 | 11.8 | 0 | 3 | — | — |
| Example 6 | 2.11 | 83.6 | 13.5 | 0 | 4 | — | — |
| Example 7 | 2.10 | 75.7 | 13.1 | 0 | 1 | — | — |
| Example 8 | 2.03 | 72.5 | 13.8 | 0 | 0 | — | — |
| Example 9 | 2.10 | 75.8 | 14.2 | 0 | 0 | 0 | 2 |
| Example 10 | 2.10 | 75.6 | 14.6 | 0 | 0 | 0 | 0 |
| Example 11 | 2.10 | 75.9 | 15.1 | 0 | 0 | 0 | 0 |
| Comparative Example 1 | 2.10 | 69.8 | 13.4 | 0 | 0 | — | — |
| Comparative Example 2 | 1.98 | 74.2 | 14.6 | 0 | 0 | — | — |
| Comparative Example 3 | — | — | — | — | — | — | — |
| Comparative Example 4 | — | — | — | — | — | — | — |
| Comparative Example 5 | 2.11 | 83.4 | 12.9 | 11 | — | — | — |

※ Maximum value in wavelength range of from 350 to 450 nm

While the present invention has been described in detail and with reference to specific embodiments, it will be apparent to those skilled in the art that various changes and modifications can be made without departing from the spirit and scope of the present invention.

Incidentally, the entire contents of the specifications, claims, drawings and abstracts of Japanese Patent Application No. 2016-002924 filed on Jan. 8, 2016 and Japanese Patent Application No. 2016-230493 filed on Nov. 28, 2016 are incorporated herein by reference as disclosure of the specification of the present invention.

INDUSTRIAL APPLICABILITY

The oxide sintered body according to the present invention is expected to be used in a sputtering target capable of providing a high-refractive-index film since it does not splash from the target surface even at the time of high power film formation and has a high film formation rate.

The invention claimed is:

1. An oxide sintered body, comprising zinc, niobium, aluminum and oxygen as constituent elements, wherein:

$Nb/(Zn+Nb+Al)=0.076$ to $0.289$, and $Al/(Zn+Nb+Al)=0.006$ to $0.031$, where Zn, Nb and Al denote atomic contents of zinc, niobium and aluminum, respectively,
wherein a crystal grain size of a ZnO phase in the oxide sintered body is 3 μm or less.

2. The oxide sintered body according to claim 1, wherein a relative density of the oxide sintered body is 98% or more.

3. The oxide sintered body according to claim 1, wherein a density of the oxide sintered body is 5.57 g/cm$^3$ or more.

4. The oxide sintered body according to claim 1, wherein a bulk resistance value of the oxide sintered body is 100 Ω·cm or less.

5. A sputtering target, comprising the oxide sintered body according to claim 1 as a target material.

6. A method for producing an oxide sintered body, the method comprising:
mixing a zinc oxide powder, a niobium oxide powder and an aluminum oxide powder as raw material powders so that atomic ratios of elements are:

$Nb/(Zn+Nb+Al)=0.076$ to $0.289$, and $Al/(Zn+Nb+Al)=0.006$ to $0.031$, where Zn, Nb and Al denote atomic contents of zinc, niobium and aluminum, respectively;
molding a mixed powder obtained; and
calcining a molded body obtained.

7. The oxide sintered body according to claim 1, wherein $Nb/(Zn+Nb+Al)=0.135$ to $0.230$, and $Al/(Zn+Nb+Al)=0.013$ to $0.025$.

8. The oxide sintered body according to claim 1, wherein a relative density of the oxide sintered body is 99% or more.

9. The oxide sintered body according to claim 1, wherein a density of the oxide sintered body is 5.61 g/cm$^3$ or more.

10. The oxide sintered body according to claim 1, wherein a density of the oxide sintered body is 5.70 g/cm$^3$ or more.

11. The oxide sintered body according to claim 1, wherein a bulk resistance value of the oxide sintered body is 50 Ω·cm or less.

12. The method according to claim 6, wherein a relative density of the oxide sintered body is 98% or more.

13. The method according to claim 6, wherein a density of the oxide sintered body is 5.57 g/cm$^3$ or more.

14. The method according to claim 6, wherein a crystal grain size of a ZnO phase in the oxide sintered body is 3 μm or less.

15. The method according to claim 6, wherein a bulk resistance value of the oxide sintered body is 100 Ω·cm or less.

16. The method according to claim 6, wherein $Nb/(Zn+Nb+Al)=0.135$ to $0.230$, and $Al/(Zn+Nb+Al)=0.013$ to $0.025$.

17. The method according to claim 6, wherein a relative density of the oxide sintered body is 99% or more.

18. The method according to claim 6, wherein a density of the oxide sintered body is 5.61 g/cm$^3$ or more.

19. The method according to claim 6, wherein a density of the oxide sintered body is 5.70 g/cm$^3$ or more.

20. The method according to claim 6, wherein a bulk resistance value of the oxide sintered body is 50 Ω·cm or less.

* * * * *